United States Patent
Simon et al.

(10) Patent No.: US 9,099,942 B2
(45) Date of Patent: Aug. 4, 2015

(54) DEVICE FOR GENERATING CURRENT AND/OR VOLTAGE BASED ON A THERMOELECTRIC MODULE PLACED IN A FLOWING FLUID

(75) Inventors: Julia Simon, Grenoble (FR); Tristan Caroff, Gieres (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 251 days.

(21) Appl. No.: 13/704,072

(22) PCT Filed: Jul. 4, 2011

(86) PCT No.: PCT/FR2011/000392
§ 371 (c)(1),
(2), (4) Date: Dec. 13, 2012

(87) PCT Pub. No.: WO2012/004472
PCT Pub. Date: Jan. 12, 2012

(65) Prior Publication Data
US 2013/0082466 A1    Apr. 4, 2013

(30) Foreign Application Priority Data
Jul. 6, 2010    (FR) ...................... 10 02847

(51) Int. Cl.
*H01L 35/30* (2006.01)
*H02N 99/00* (2006.01)

(52) U.S. Cl.
CPC ............... *H02N 99/00* (2013.01); *H01L 35/30* (2013.01)

(58) Field of Classification Search
CPC ............................................ H01L 35/00–35/34
USPC ................................................. 136/200–242
See application file for complete search history.

(56) References Cited

U.S. PATENT DOCUMENTS

| | | |
|---|---|---|
| 5,994,637 A | 11/1999 | Imanishi et al. |
| 6,005,182 A | 12/1999 | Imanishi et al. |
| 2002/0148234 A1* | 10/2002 | Bell ................................ 62/3.3 |
| 2002/0148235 A1 | 10/2002 | Bell |

FOREIGN PATENT DOCUMENTS

| EP | 1 530 243 A2 | 5/2005 |
|---|---|---|
| JP | A-2001-65858 | 3/2001 |

OTHER PUBLICATIONS

Jan. 4, 2015 Office Action issued in Chinese Application No. 201180042880.3.

* cited by examiner

*Primary Examiner* — Bach Dinh
(74) *Attorney, Agent, or Firm* — Oliff PLC

(57) ABSTRACT

The device for generating current and/or voltage includes means for making a fluid flow between an inlet and an outlet of the device, and a thermoelectric module having a first active surface exposed to the fluid. The thermoelectric module includes apertures, and is placed in the path of the fluid between the inlet and the outlet of the device, the first active surface being substantially perpendicular to the direction of flow of the fluid.

13 Claims, 5 Drawing Sheets

DEVICE FOR GENERATING CURRENT AND/OR VOLTAGE BASED ON A THERMOELECTRIC MODULE PLACED IN A FLOWING FLUID

BACKGROUND OF THE INVENTION

The invention relates to a device for generating current and/or voltage comprising:

- means for making a fluid flow between an inlet and an outlet of the device,
- a thermoelectric module comprising a first active surface exposed to the fluid, the thermoelectric module comprising apertures and being placed in the path of the fluid between the inlet and the outlet of the device, the first active surface being substantially perpendicular to the direction of flow of the fluid.

STATE OF THE ART

There is an increasing interest in thermoelectricity for power generation applications, in particular in the industrial environment where the majority of the consumed energy is dissipated in the form of heat in a manner that serves no useful purpose. The dissipated heat is often conveyed by gaseous or liquid media with temperatures of about 100° C. making energy recovery solutions rather ineffective and difficult to implement.

In order to recover a part of the drained-off energy, thermoelectric modules have been developed enabling the piping conveying products or gases at high temperatures to be surrounded.

As illustrated in FIG. 1, such a device seen in transverse cross-section comprises a pipe 1 in which a fluid flows (perpendicularly to the plane of the sheet for FIG. 1) at high temperature forming a hot source. The external surface of pipe 1 is coated by a plurality of elementary thermoelectric modules 2 each comprising thermocouples 3a, 3b electrically connected in series and thermally connected in parallel so as to form hot junctions at the level of a first surface of the module and cold junctions at the level of a second surface of the module, opposite the first surface. The hot junctions are represented by connecting elements 4 electrically connecting two bumps 5a, 5b made from thermoelectric material to form a thermocouple. The cold junctions are represented in FIG. 1 by linking elements 6 connecting two adjacent thermocouples in series. In FIG. 1, the first surface of the module is curved so as to snugly follow the external surface of pipe 1. Pipe 1 is inserted in a heat exchanger 7 of polygonal shape comprising internal pipes 8 for flow of a cooling liquid. The second surface of each module 2 is in thermal contact with this heat exchanger 7 so as to optimize the temperature gradient between the hot junctions and the cold junctions. Making use of the thermal gradient then either enables current to be generated by Seebeck effect or a load to be supplied in "energy recovery" function, or a voltage to be measured in "sensor" function.

In the device described in the foregoing, the thermoelectric modules being located around pipe 1, the thermal resistance of pipe 1 is responsible for a temperature decrease at the level of the hot junction. The temperature gradient will then be more or less optimized, according to the size of pipe 1, the thickness of pipe 1 and the materials used.

The document JP2001065858 describes a device having a gas flowing through thermoelectric elements.

OBJECT OF THE INVENTION

The object of the invention is to provide a device for generating current and/or more voltage optimizing energy recovery when one of the energy sources is in the form of a moving fluid.

This object tends to be met by the appended claims and more particularly by the fact that the thermoelectric module comprises thermocouples, each thermocouple comprising two electrically conducting bumps electrically connected to one another at the level of the first active surface of the thermoelectric module to form an associated hot or cold junction, the thermocouples being electrically connected in series at the level of a second active surface of the module to form complementary junctions, and in that the thermocouples are integrated in a thermally insulating substrate, the thermoelectric module being perforated by pass-through apertures made in the substrate.

According to one embodiment, the module comprises a matrix of holes connecting the first active surface to the second active surface, a thermocouple bump being adjacent to four holes.

According to another embodiment, the module comprises a series of holes arranged in staggered manner connecting the first active surface to the second active surface, a thermocouple bump being adjacent to three holes.

According to another embodiment, the module comprises a matrix of holes connecting the first active surface to the second active surface, a set of four thermocouple bumps being surrounded by four holes, each bump being adjacent to two holes of these four holes.

BRIEF DESCRIPTION OF THE DRAWINGS

Other advantages and features will become more clearly apparent from the following description of particular embodiments of the invention, given for non-restrictive example purposes only and represented in the appended drawings, in which.

DESCRIPTION OF PREFERRED EMBODIMENTS

Unlike devices of the prior art where the thermoelectric modules are located outside the flow of the hot or cold source and surround the pipes in which the fluid flows, the device described in the following comprises a thermoelectric module directly placed in the fluid, a thermoelectric module through which the hot or cold fluid flows to make use of a temperature gradient therein while at the same time limiting disturbance of the flow of the fluid. The thermoelectric module can supply current and/or a voltage. Depending on the application, one or the other or both parameters (power) can be used.

Figure 1:
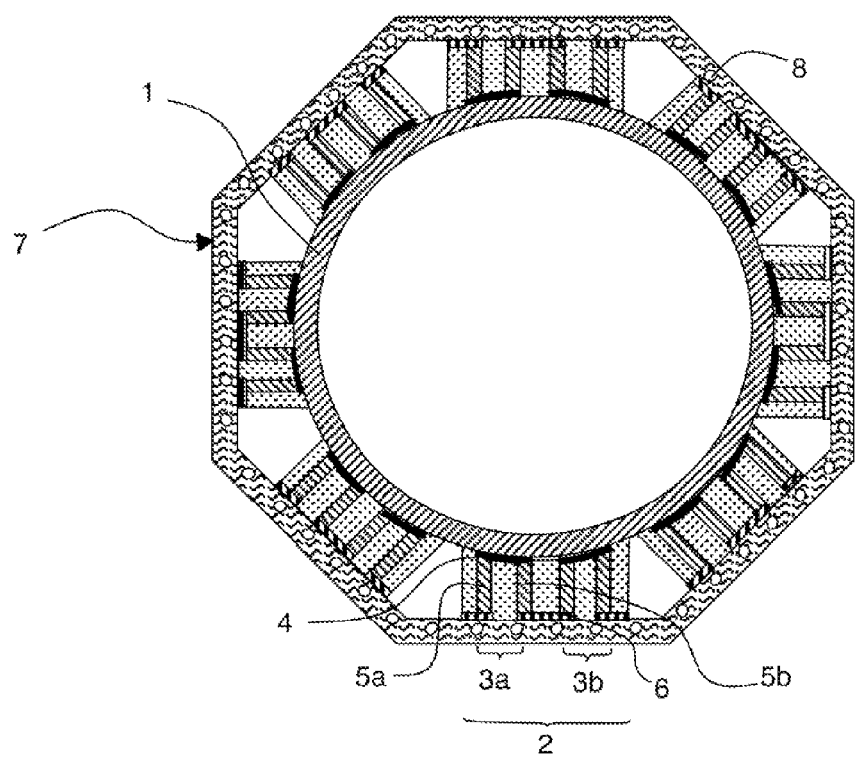
FIG. 1 illustrates a device for generating current according to the prior art.
Figure 2:
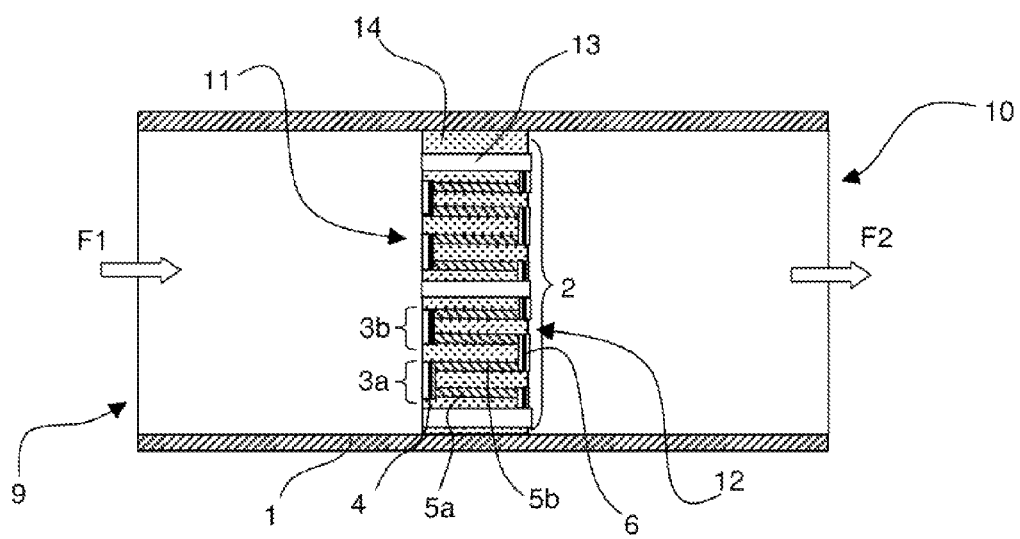
FIGS. 2 to 4 illustrate different embodiments of the device according to the invention.
Figure 3:
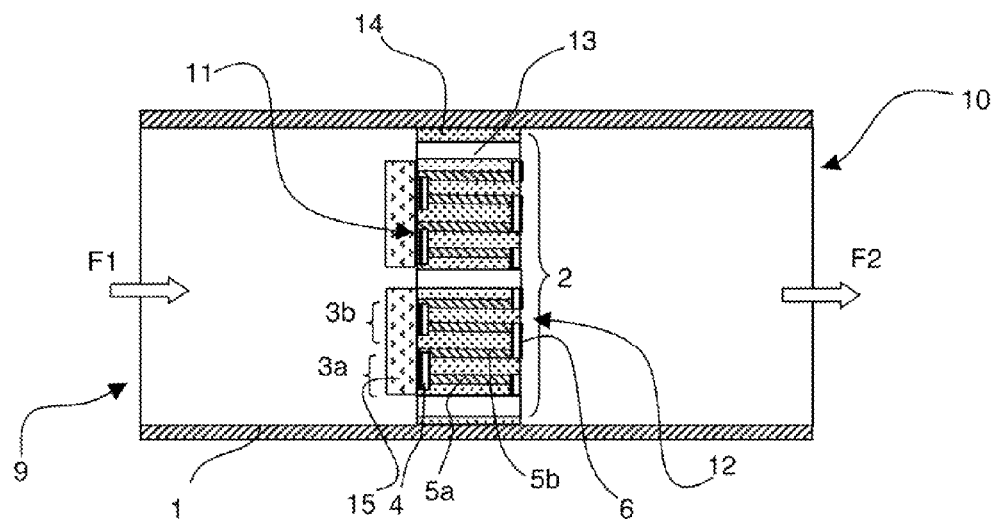
Figure 4:
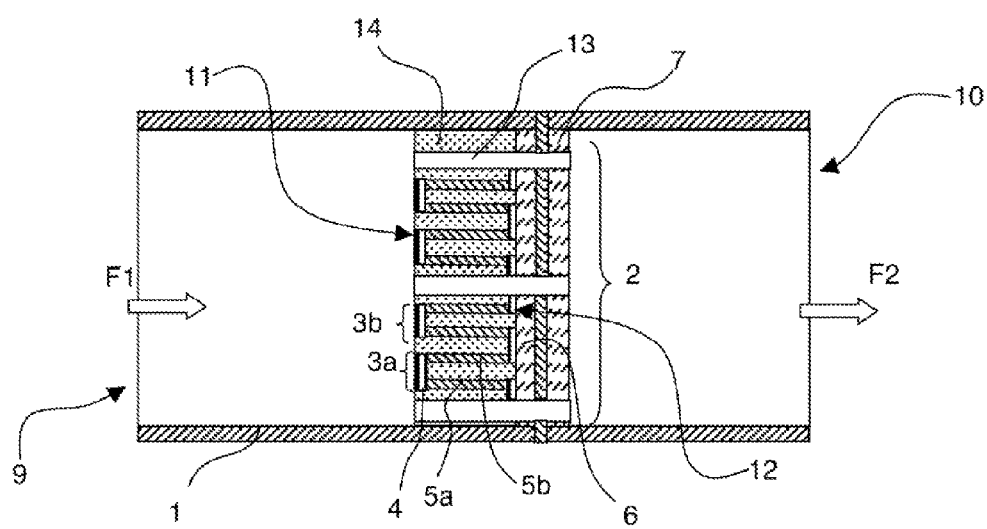

As illustrated in FIGS. 2 to 4 which are longitudinal cross-sections of the device, the device for generating current and/or voltage comprises means for making a fluid flow between an inlet 9 and an outlet 10 of the device. These fluid circulation means can be a fan, a pump, or any other type of means implemented by the person skilled in the art to enable flow of the fluid. A thermoelectric module 2 comprising apertures is arranged in the path of the fluid (represented by arrows F1 and F2) between inlet 9 and outlet 10 of the device so that the fluid can flow through the module without the latter preventing flow of the fluid. Thermoelectric module 2 comprises a first active surface 11 exposed to the fluid, said first active surface 11 being substantially perpendicular to the direction of flow of the fluid. In other words, first active surface 11 is facing the fluid in its direction of flow. In thermoelectricity, an active surface of a module is a surface able to be equipped with hot or cold junctions designed to use a temperature gradient to generate a current by Seebeck effect and/or a voltage.

In FIGS. 2 to 4, the thermoelectric module is located in a pipe 1. This pipe 1 can convey a fluid of liquid or gaseous type in the direction of flow indicated by arrows F1 and F2. In certain applications, pipe 1 may not be materialized. The device can further have a smaller size than the cross-section of flow of the fluid.

Conventionally, thermoelectric module 2 can comprise a plurality of thermocouples 3a, 3b electrically connected in series and thermally connected in parallel. A thermocouple can comprise two bumps 5a, 5b made from electrically conducting materials enhancing the thermoelectric effects. For example, a BiTe alloy will be used for fluid temperatures comprised between 20° C. and 200° C., a PbTe alloy will be used for temperatures comprised between 300° C. and 600° C. and a SiGe alloy for temperatures of more than 600° C. Generally, the two bumps 5a, 5b of one and the same thermocouple 3a comprise different materials and/or materials having different doping types, N-doped or P-doped. In general manner, each thermocouple 3a, 3b comprises two electrically conducting bumps 5a, 5b electrically connected to one another at the level of first active surface 11 of module 2 to form an associated hot or cold junction (depending on the temperature of the fluid), thermocouples 3a, 3b being electrically connected in series at the level of a second active surface 12 of the module, preferably opposite first active surface 11, to form complementary junctions. In FIGS. 2 to 4, the two bumps 5a, 5b of thermocouple 3a are electrically connected in series by an electric connecting element 4 preferably located at the level of the first active surface of the module to form a hot junction or a cold junction, depending on whether the fluid flowing in pipe 1 is hot or cold. What is meant by hot or cold is temperatures such that a temperature gradient of more than 10° C. is established between the two active surfaces of the thermoelectric module. A value between 10° C. and more than 1000° C. is typically used, and in standard manner this value is comprised between 10° C. and 100° C. Thermocouples 3a, 3b are then electrically connected in series at the level of a second active surface 12 of module 2 to form complementary cold or hot junctions depending on the type of junctions situated at the level of first active surface 11. This link can be achieved by electrically conducting linking elements 6 situated at the level of second active surface 12. In FIGS. 2 to 4, first active surface 11 is opposite and parallel to second active surface 12.

Perforated thermoelectric module 2 can comprise a plurality of pass-through holes 13 connecting first active surface 11 of module 2 to second active surface 12 of module 2.

Thermocouples 3a, 3b are preferably integrated in a substrate 14 preferably having a thickness substantially equal to the height of thermocouples 3a, 3b or to the height of bumps 5a, 5b of thermocouples 3a, 3b. In other words, connecting elements 4 and linking elements 6 can be flush with substrate 14 as in FIGS. 2 to 4, or form protuberances (not shown) on each side of substrate 14. Other arrangements can naturally be implemented by the person skilled in the art.

Pass-through holes 13 enabling free flow of the fluid through thermoelectric module 2 can then be made in substrate 14 in which holes are drilled according to a particular geometry. The selected substrate 14 can be of any nature such as for example ceramic, oxide, etc. It is nevertheless advantageous to choose a substrate of polymer or plastic type enabling a certain flexibility, fabrication of components of large surface, and easy perforation to form the holes. The material used for substrate 14 will preferably be a good thermal insulator so as to limit the temperature increase of bumps 5a, 5b in order to keep an optimum temperature gradient between the two active surfaces 11, 12 of thermoelectric module 2.

In fact, as illustrated in FIGS. 2 to 4, bumps 5a, 5b are advantageously coated by substrate 14 along their longitudinal axis. The inner walls of pass-through holes 13 between the first active surface and second active surface 11, 12 are delineated by substrate 14 which is distinct from the thermocouples. In other words, when a fluid flows through thermoelectric module 2, it does not lap against bumps 5a, 5b over their length.

Naturally, to prevent short-circuiting, the material of substrate 14 is also electrically insulating.

According to the embodiment of FIG. 2, the hot or cold junctions formed by electrically connecting elements 4 at the level of first active surface 11 are directly in contact with the fluid flow. The temperature at the level of first active surface 11 will therefore be closer to that of the fluid, unlike the prior art where the pipe generated a temperature loss. To prevent short-circuiting, in particular in the case where the fluid is an electrically conducting liquid, first active surface 11 can be covered by an electrically insulating and thermally conducting film, for example a thin foil of 100 μm to 500 μm made from anodized aluminium; any type of means enabling short-circuiting of connecting elements 4 of first active surface 11 to be prevented can naturally be used by the person skilled in the art.

According to an improvement illustrated in FIG. 3 using all the same references as FIG. 2, to improve the efficiency of the device, heat exchange means 15 are arranged at the level of first active surface 11, preferably in direct contact with the hot or cold junctions of said first active surface 11. The role of these heat exchange means 15 is to transfer the heat flux of the fluid flowing between inlet 9 and outlet 10 in optimal manner so as to maximize the temperature of the junctions of first active surface 11 with as little losses as possible. These heat exchange means 15 can be formed by fins of different shapes absorbing the heat of the fluid. For example, straight fins (called heat sink) or undulating fins can be used. The person skilled in the art will have understood that heat exchange means 15 are located and arranged so as not to obstruct the holes of module 2.

According to an improvement illustrated in FIG. 4, the device comprises a heat exchanger 7 in thermal contact with second active surface 12 of thermoelectric module 2. This heat exchanger 7 can comprise a heat sink with flow of water, or another heat transfer fluid, serving the purpose of cooling or heating second active surface 12 of module 2 according to the temperature of the fluid. Heat exchanger 7 is located and arranged so as not to obstruct the holes of module 2.

It is naturally possible to combine the improvements of FIGS. 3 and 4 to optimize the temperature gradient between first and second active surfaces 11, 12 of thermoelectric module 2.

In general manner, to electrically insulate first active surface 11 from heat exchange means 15 and second active surface 12 from heat exchanger 7 if required, an electrically insulating and thermally conducting material be placed at the respective interface of the latter. Such a material can for example be the same thin sheet of anodized aluminium foil as the one referred to in the foregoing.

In order to validate the improvements of FIG. 4 and the combination of FIGS. 3 and 4, a computer rack enclosure with a height of 1.8 m and a width of 1 m was produced in which the equipment generates hot air with a temperature of about 60° C., thereby supplying a thermal power of about 30 kW. One wall of the enclosure is drilled with pass-Through holes over about 70% of the surface of the wall (1.8 m² in the example) to enable air to flow from the inside of the enclosure, then forming the inlet, to the outside of the enclosure, then forming the outlet.

Figure 5:
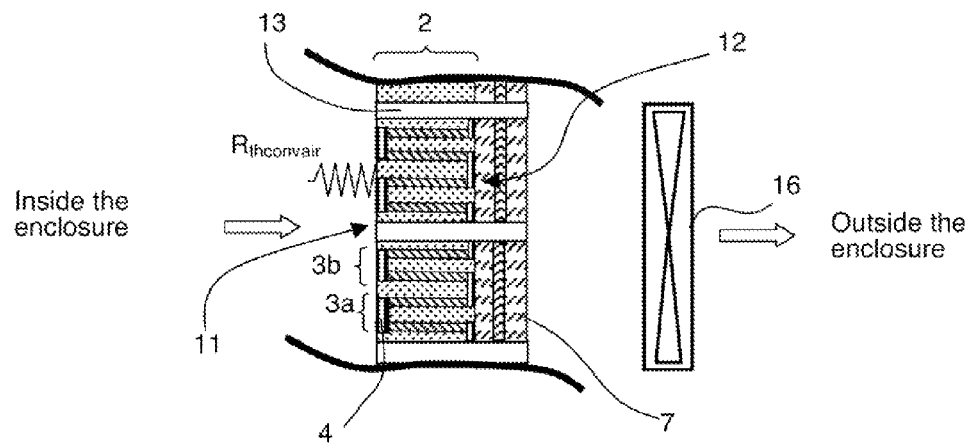
FIGS. 5 and 6 illustrate two particular implementations of a device according to the invention in a computer rack enclosure.
Figure 6:
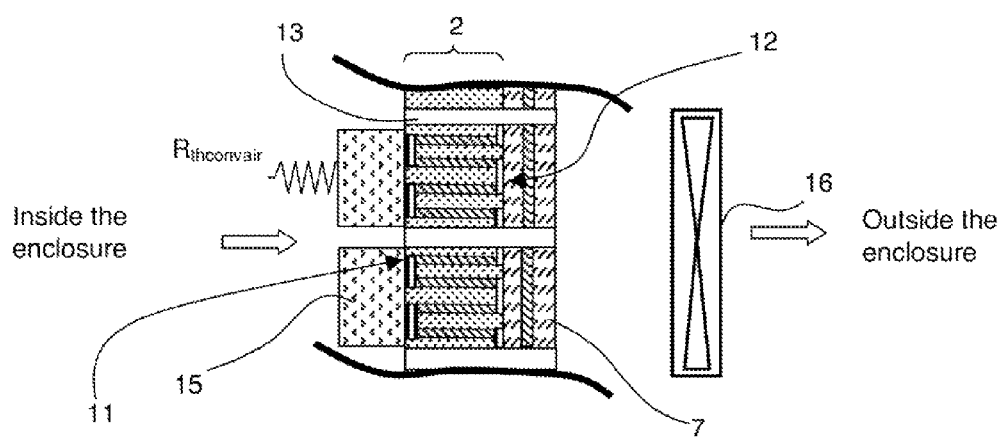

FIGS. 5 and 6 illustrate two types of implementation. In these figures, the air flow can be generated by a fan 16, for example an extraction fan located along the wall, for example outside the enclosure in the particular example embodiment. The wall is equipped with a cooling system forming heat exchanger 7 of the device for generating current and/or voltage, based on circulation of a cold liquid at 7° C. Thermoelectric module 2 is placed in the enclosure pressed against the wall, first active surface 11 of the module being directed towards the inside of the enclosure and second active surface 12 of the module being in contact with the wall, i.e. heat exchanger 7. The holes made in the module are formed at the level of the holes of the wall, the filling rate of the thermocouples being 50% on the 30% of available surface of the wall.

In a first case illustrated in FIG. 5, thermocouples 3a, 3b have their hot junctions (represented by connecting elements 4) directly in contact with the air flow, the thermal resistance $R_{thconvair}$ is then about 0.06 K/W in accordance with $R_{thconvair}=1/(h*S)$ with h=30 W/m²/K, S=30% of 1.8 m². On the heat exchanger 7 side, the thermal resistance between second active surface 12 of the module and the cooling liquid is equal to $R_{thexchanger}=1/(h*S)=0.006$ K/W with h=300 W/m² K and S=30% of 1.8 m².

In a second case illustrated in FIG. 6, heat exchange means 15 have been added, with respect to FIG. 5, at the level of first active surface 11 to optimize the temperature on the hot junctions. These heat exchange means 15 can be fins multiplying the heat exchange surface S by twenty. By means of this assembly, $R_{thconvair}=0.003$ K/W is obtained with h still equal to 36 W/m²/K and S=30% of 1.8 m² multiplied by twenty.

According to a third case (not represented), heat exchanger 7 of FIG. 6 is optimized by using a cold wall, i.e. a heat exchanger with circulation of cooling liquid in immediate proximity to the cold junctions of the thermoelectric module. This enables the thermal resistance between the module and the cooling liquid to be reduced for example by a factor 10. Such means can be achieved by a plate heat exchanger in direct contact with the associated junctions, or other types of heat exchangers performing the same function. With this layout, $R_{thexchangerwall}=0.1*R_{thexchanger}=0.0006$ K/W is obtained.

In the first case, the thermal power is 1400 W for a temperature of 21° C. at the level of the hot junctions, and a temperature of 16° C. at the level of the cold junctions. The thermal power generated is 7.5 W for a surface coverage of 30%, and 15 W for a surface coverage of 50%.

In the second case, the thermal power is 5200 W for a temperature of 53° C. at the level of the hot junctions, and a temperature of 37° C. at the level of the cold junctions. The thermal power generated is 80 W for a surface coverage of 30%, and 130 W for a surface coverage of 50%.

In the third case, the thermal power is 10000 W for a temperature of 55° C. at the level of the hot junctions, and a temperature of 25° C. at the level of the cold junctions. The thermal power generated is 270 W for a surface coverage of 30%, and 450 W for a surface coverage of 50%.

The use of heat exchange means 15 at the level of first active surface 11 combined with heat exchanger 7 of second active surface 12 thus enables more current and/or voltage to be generated for the same surface.

The distribution of holes 13 and the arrangement of thermocouples 3a, 3b preferably respect a certain geometry in order to enable operation of the device for generating current and/or voltage while avoiding disturbing flow of the fluid to as great an extent as possible.

FIGS. 7 to 10 illustrate four embodiments of the thermoelectric module partially constituting the device for generating current and/or voltage. These embodiments are illustrated by cross-sectional views of the module, the fluid flowing through the module perpendicularly to the plane of the sheet.

Figure 7:
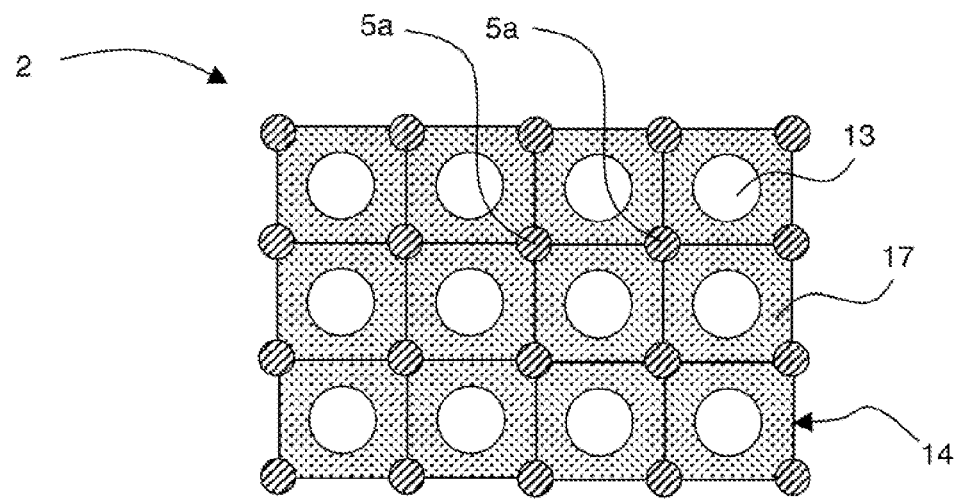
FIGS. 7 to 10 illustrate different embodiments of the geometry of the thermoelectric module used in the invention.

FIG. 7 represents a cross-sectional view of the module according to a first embodiment, the module comprises a matrix of holes 13 connecting the first active surface of the module to the second active surface of the module, i.e. pass-through holes, a thermocouple bump 5a being adjacent to four holes. This embodiment can be implemented by virtually subdividing substrate 14 into elementary lattices 17. The thermocouples are formed in the substrate. The elementary lattices can have the shape of a cylinder, a cylinder can be formed by a closed generating curve in a plane and a directing curve keeping a fixed direction, perpendicular to the plane, while passing through the points of the generating curve. In FIG. 7, the lattices 17 are formed by a cylinder having a directing curve which forms a square defining four lattice edges substantially perpendicular to the first active surface and to the second active surface at the level of each lattice 17. In other words, the cylinder comprises four lateral surfaces connecting the first and the second active surfaces. A thermocouple bump 5a, 5b is located at the level of each lattice edge, two adjacent lattices 17 having two bumps in common. Each lattice comprises a pass-through hole having a longitudinal axis which is preferably parallel to the edges of the lattice and preferably situated at equal distance from the edges. In other words, pass-through hole 13 can have the shape of a straight circular cylinder. The linking and connecting elements (not shown) are respectively located on or at the level of the first active surface and the second active surface.

In order to optimize the geometry, each elementary lattice 17 of the embodiment of FIG. 7 has a lattice cross-section surface in the plane of the sheet of FIG. 7 of $x^2$, the cross-section surface of a bump, in the same plane, is defined by $\pi*r^2$, r being the radius of the cross-section of the bump if the latter has a cross-section in the form of a circle. The maximum radius $r_{max}$ of a bump is smaller than x/2 to prevent lateral contact between bumps. This defines the maximum surface of bumps are able to be integrated i.e. $S_{maxbump}=\pi*r_{max}^2 2=78.5\%$ of the surface of the lattice in the case of a lattice of square cross-section.

Pass-through hole 13, when it has the shape of a straight circular cylinder in the lattice, defines a passage surface of $\pi R^2$, R being the radius of hole 13 drilled in substrate 14. Geometric production limitations limit the value of R to a maximum value defined as a function of x and r. The maximum radius $R_{max}$ of the hole is thus equal to $$\frac{x}{2} - r.$$

Electrically conducting elements are made at the level of the first active surface and of the second active surface to form the connecting elements and the linking elements (not visible in FIG. 7) and to connect the bumps to one another. For geometric reasons, the maximum radius $r_{max}$ of the bumps will naturally be strictly less than $$\frac{x}{2}.$$

Considering a linking element or a connecting element having a longitudinal dimension which corresponds to the distance separating two bumps electrically connected in series, the width of such an element is preferably smaller than twice the radius of the cross-section of a bump, and the element is arranged so as not to obstruct the pass-through hole.

Figure 8:
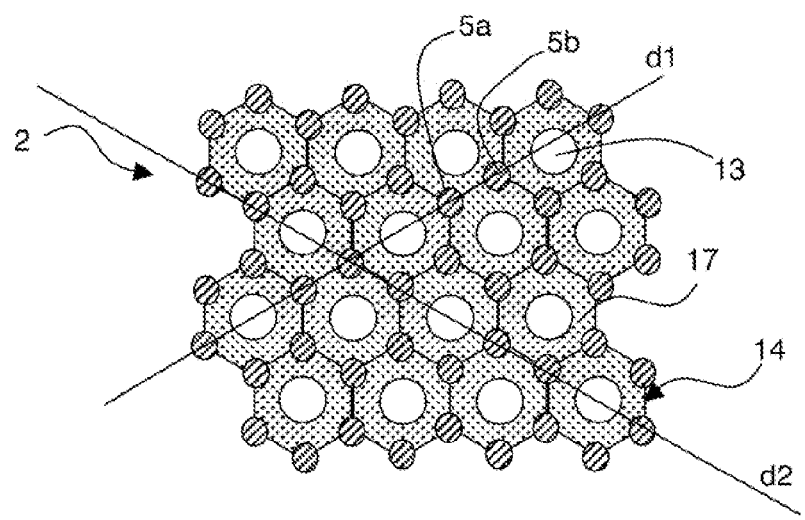

FIG. 8 represents a cross-sectional view of the thermoelectric module according to a second embodiment, the latter comprises a series of staggered holes 13 connecting the first active surface of the module to the second active surface of the module, i.e. pass-through holes, a thermocouple bump 5a, 5b being adjacent to three holes 13 (with the exception of the edge bumps of the module). This embodiment can be implemented by virtually subdividing substrate 14 in which the thermocouples are formed into elementary lattices 17. In FIG. 8, lattices 17 are formed by a cylinder having a directing curve forming a regular hexagon defining six lattice edges connecting the first active surface to the second active surface at the level of each lattice 17. In other words, each lattice comprises six lateral surfaces connecting the first active surface to the second active surface. A thermocouple bump 5a, 5b is located at the level of each lattice edge, two adjacent lattices having two adjoined lateral surfaces and two bumps 5a, 5b in common. Each lattice 17 comprises a pass-through hole 13 with a longitudinal axis that is preferably parallel to the lattice edges and is preferably located at equal distance from the lattice edges. In other words, the pass-through hole can have the shape of a straight circular cylinder.

By working with a lattice surface identical to the lattice surface of the first embodiment, a lattice surface $x^2=3^{3/2}a^2 \div 2$ i.e. $a=2^{1/2}x \div 3^{3/4}$ is obtained with a the distance separating two adjacent edges of one and the same lateral lattice surface, i.e. the length of a side of the hexagon.

In order to optimize the geometry, each elementary lattice of the embodiment of FIG. 8 has a lattice surface cross-section in the plane of the sheet in FIG. 8 of $x^2$ (constant surface with respect to the first embodiment), the surface of the cross-section of a bump in the plane of the figure is defined by $\pi*r^2$, r being the radius of a bump if the latter has a cross-section in the form of a circle. The maximum radius of a bump is less than a/2 to prevent contact between two bumps. This defines the maximum surface of thermocouples able to be integrated i.e. 60.4% of the surface in the case of a lattice of hexagonal cross-section.

As for the first embodiment, pass-through hole 13, when it has the shape of a straight circular cylinder in the lattice, defines a cross-section with a flow surface of $\pi*R^2$, R being the radius of the hole drilled in substrate 14.

Limitations of what can be geometrically achieved limit the value of R to a maximum value defined as a function of x, a and r. The maximum radius $R_{max}$ of the hole is thus equal to a−r, i.e. 0.62 x−r. Electrically conducting elements (not shown) are made at the level of the first active surface and of the second active surface to form the connecting elements and the linking elements. For geometric reasons, the maximum radius of the bumps will be strictly less than $$\frac{a}{2}$$

i.e. 0.31 x.

A hexagonal lattice cross-section therefore enables a fluid flow cross-section that is larger than the square lattice.

For the same surface unit $x^2$, the arrangement in the form of hexagonal lattices enables a fluid flow cross-section to be achieved that is always larger than that of a lattice of square cross-section. Furthermore, the lattice of hexagonal cross-section is more compact than the geometry based on lattices of square cross-section, and therefore enables more thermocouples to be integrated within one and the same module.

Substrate 14 of the thermoelectric module preferably has a higher thermal conductivity k than that of air (k=0.17 W/m*K for the polyimides with the best performances, compared with the thermal conductivity of air of 0.024 W/m*K). Thus, in the case where the fluid has a lower conductivity than that of the substrate, the more substrate 14 is drilled the lower the mean thermal conductivity of the thermoelectric module will be with a constant thermocouple filling ratio, and the larger the thermal gradient between the two active surfaces of the thermoelectric module will be. This therefore results in increased performances for the embodiment with lattices of hexagonal cross-sections.

For a given material, a given thermocouple height, and a given temperature gradient, an optimum thermoelectric filling ratio (number of thermocouples) can exist to optimize the performances in terms of power delivered by the module. This filling ratio may prove to be higher than the maximum ratio of 60.4% defined by the hexagonal geometry. An optimum trade-off will then have to be sought for between the power generated by the thermoelectric module and the pressure losses induced on the flow of the fluid. In other words, if it is sought to obtain a ratio of less than 60.4%, the structure with a lattice of hexagonal cross-section will be preferred, and if it is sought to obtain a ratio of more than 60.4%, the structure with a square lattice will be preferred, everything in fact depending on the required geometry of the module and of the bumps. The geometry with a hexagonal cross-section is the one which limits disturbance of the fluid flow to the greatest extent.

The second embodiment based on lattices 17 of regular hexagonal cross-sections enables a device to be produced in simplified manner avoiding problems of self-alignment. By means of such a geometry, with the exception of the lattices situated at the edges of thermoelectric module 2, a straight line d1 passing via two adjacent bumps 5a, 5b of the same lattice surface 17 will in fact open out in a hole 13 on either side of these two bumps before again meeting another bump.

The fabrication method of the module can be performed based on bulk materials or thermoelectric pastes.

In the case of bulk materials, the different bumps 5a, 5b of the future thermoelectric module 2 are first of all located and formed at the level the edges of each hexagonal lattice 17, two adjacent lattices 17 having two bumps in common and two adjoining lateral surfaces. Two adjacent bumps of the same lattice surface are preferably formed from different materials. One of the materials is preferably P-doped and other of the materials is N-doped. Each lattice 17 thus comprises six bumps three of which are P-doped and three of which are N-doped, the bumps of a lattice being alternately P-doped and N-doped.

After bumps 5a, 5b have been formed, the latter are sunk in a polymer that is chosen to have a low thermal conductivity k, such as for example high-temperature epoxy resin (k<0.5 W/m*K), in order to maximize the thermal gradient between the two active surfaces of the future thermoelectric module. After the polymer has been shaped, for example by solidification, by annealing, by cross-linking under UV or other, it will be polished if necessary so that the distal ends of each bump are flush on the two opposite surfaces of the module (future active surfaces).

The electric connections are then made on a first surface of the module where the bumps are flush. A step consists in making parallel lines (in the direction of d1 in FIG. 8) made from electrically conducting material on the first surface of substrate 14, these lines being able to be made by printing or deposition techniques compatible with the materials of the module. The width of each line will be strictly not zero to enable flow of the current and smaller than or equal to the diameter of the bumps. A line passes through at least two bumps associated with the same lateral surface of the lattice. The pitch separating two adjacent parallel lines is equal to $$\frac{\sqrt{3}}{2} \times a$$

where a defines the length of one of the sides of the hexagon.

Other electric connections are then made on a second surface of the module opposite the first surface, these connections being able to be made by lines d2 made from metallic or more generally electrically conducting material, these lines d2 being parallel to one another at the level of the second surface. The geometrical criteria are identical to those of the first surface, a line d1 associated with the first surface making an angle of $$\frac{2}{3}\pi$$

with a line d2 of the second surface in the case of the hexagonal lattice structure.

To finish, holes are drilled in substrate 14 from the first surface to the second surface, preferably at the level of each lattice 17. The centre of these holes 13 preferably corresponds to the centre of the hexagons. The holes thus automatically cut the connection lines made from electrically conducting material of the first surface and second surface when the latter diametrically cut a lattice, spatially and automatically defining the connecting elements and linking elements of the module referred to in the foregoing.

In the case where thermoelectric pastes are used, the method differs from the one described in the foregoing for the steps of formation of P-type and N-type bumps and for the moulding step, which are replaced by a first step of drilling an opening in a substrate 14 chosen to have a low thermal conductivity k, such as for example a polyimide-base substrate (k<0.17 W/k*m), so as to delineate the locations of future bumps 5a, 5b. The openings are then formed in alignment with the edges of each lattice. Two adjacent lattices 17 are joined at the level of two respective lateral surfaces and have two openings/future bumps 5a, 5b in common. Bumps 5a, 5b, preferably of P-type and N-type, are then made in the openings formed in substrate 14 at the locations of the edges by printing technologies such as inkjet, dispensing by microvalve, spraying or screen printing. In the case where spraying or screen printing is used, a mask has to be previously formed discriminating the openings that are to be filled from those that are to remain empty. Two adjacent bumps 5a, 5b of one and the same lateral surface of the cylinder of hexagonal cross-section are preferably formed from different materials, one of the materials preferably being P-doped and the other being N-doped. Each lattice thus comprises six bumps three of which are P-doped and three of which are N-doped.

The remainder of the method remains identical to that described in the foregoing starting from the step of formation of the electric connections at the level of the first surface.

Figure 9:
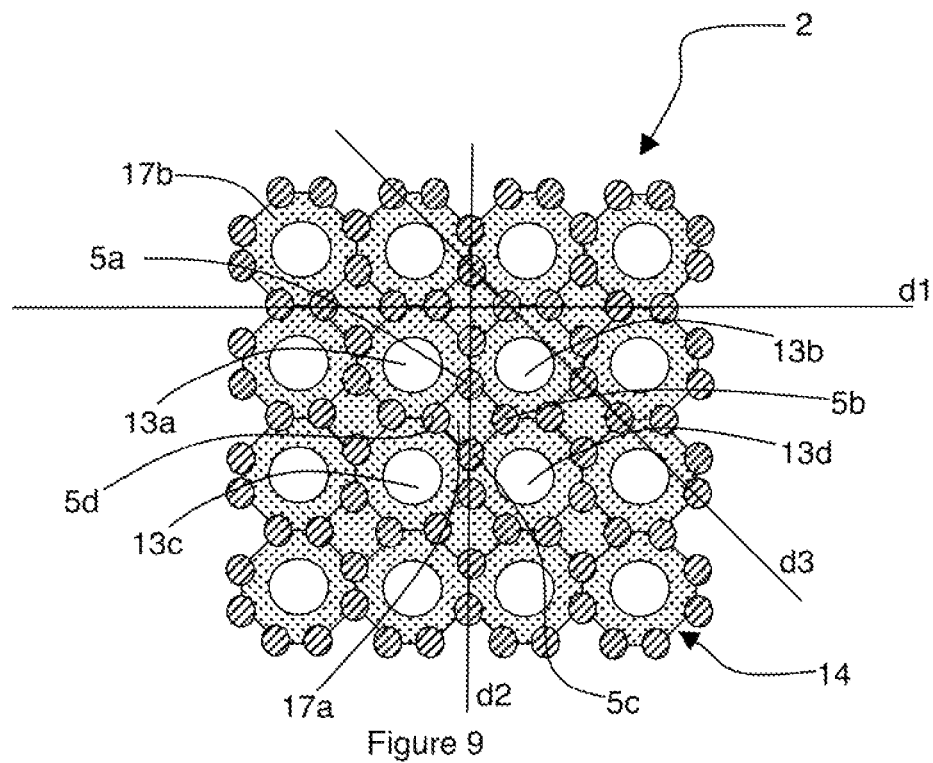
Figure 10:
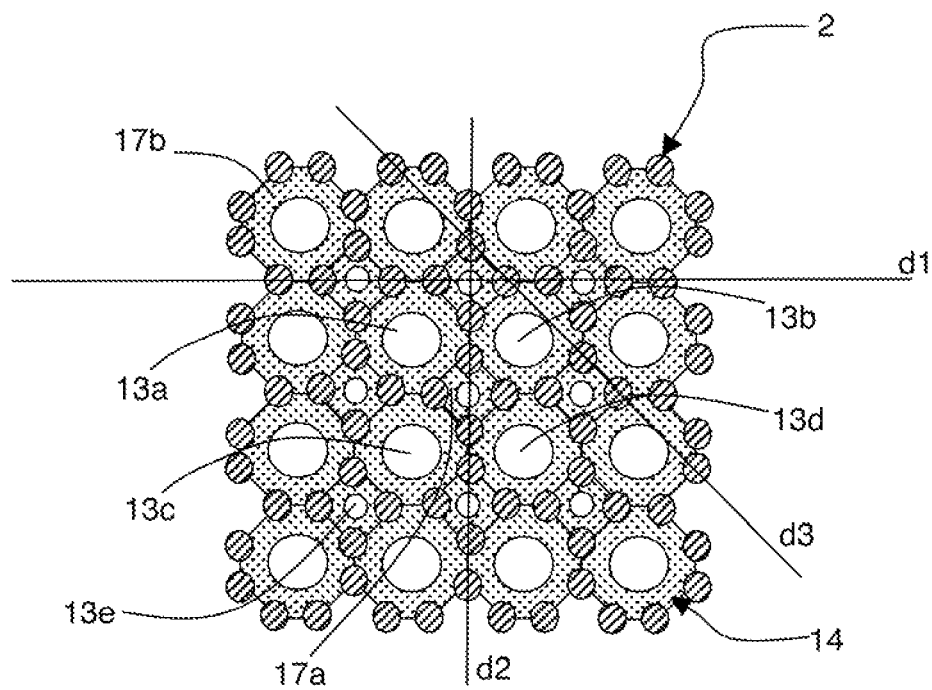

According to another embodiment illustrated in FIG. 9, module 2 comprises a matrix of holes connecting the first active surface to the second active surface. A set of four thermocouple bumps 5a, 5b, 5c, 5d is surrounded by four holes 13a, 13b, 13c, 13d, each bump of the set being adjacent to two holes of these four holes. This embodiment can be implemented by the particular arrangement of FIG. 9. Substrate 14 can thus be subdivided virtually into elementary lattices formed by cylinders 17a the directing curve of which forms a square (four lateral surfaces connecting the first active surface and the second active surface) and cylinders 17b the directing curve of which forms a regular octagon (eight lateral surfaces connecting the first active surface and the second active surface). In FIG. 9, these cylinders are adjoined to one another and virtually divide a monoblock substrate. Thus, with the exception of the edge cylinders, an octagonal cylinder is adjacent to four other octagonal cylinders, i.e. four of its lateral surfaces, opposite two by two, are in contact with complementary lateral surfaces of another octagonal cylinder. The two first opposite lateral surfaces are located in parallel planes and the two second opposite lateral surfaces are located in parallel planes perpendicular to the planes of the opposite first surfaces. The other lateral surfaces of the octagonal cylinder are each in contact with a lateral surface of a cylinder of square cross-section. Bumps 5a, 5b, 5c, 5d are formed from P-type or N-type material at the level of the edges of the octagonal cylinder, each bump being common to two edges of two adjacent octagonal cylinders and to a cylinder edge of square cross-section (with the exception of the edge cylinders). The lattices formed by the octagonal cylinders each comprise a pass-through hole 13a connecting two opposite surfaces of the module. The cylinders of square shape preferably also comprise a pass-through hole 13e as illustrated in FIG. 10.

This embodiment can be achieved by means of the method described in the foregoing with the sole difference that each octagonal cylinder comprises eight bumps arranged at the level of the edges on the circumference of the octagonal cylinder by a succession of two N-type bumps, one P-type bump, one N-type bump, two P-type bumps, one N-type bump and one P-type bump. The connections between bumps are then formed on the first surface of the module and comprise fabrication of two arrays of dense lines made from electrically conducting material. In the first array of lines substantially parallel to one another and passing via two bumps of the same octagonal lattice surface before passing diametrically through a lattice of square cross-section, two adjacent lines are separated by a distance generally equal to the distance separating two opposite lateral surfaces of the cylinder of octagonal cross-section. In the same way, in the second array of lines d2, substantially parallel to one another and passing via two bumps of the same octagonal lattice surface before diametrically passing through a lattice of square cross-section, two adjacent lines are separated by a distance substantially equal to the distance separating two opposite lateral surfaces of the cylinder of octagonal cross-section. The first and second arrays are substantially perpendicular to one another. The connections formed on the second surface of the module comprise a third array of lines d3 parallel to one another and made from an electrically conducting material. Each line of the third array passes at least via two bumps associated with the same surface of a cylinder of octagonal cross-section. Lines d3 of the second surface of the module make an angle of $$\frac{3\pi}{4}$$

with respect to the lines of the first array and of the second array of the first surface of the module. Parallel lines d3 of the third array are successively and cyclically separated by a distance equal to $$\frac{a}{\sqrt{2}}$$

then a, a being the length of a side of the octagon.

The pass-through holes made in the cylinders of octagonal cross-section preferably have a sufficient diameter to cut the lines of the second surface of the module at the level of each cylinder of octagonal cross-section. The holes made in the cylinders of square cross-section enable the lines of the first and second arrays to be cut if required.

The device as described enables large surfaces to be instrumented to recover energy. Fabrication of large-surface thermoelectric components for energy recovery applications based on low-grade heat enables reasonable efficiencies to be attained. Fabrication using low-cost printing techniques further enables the use of any type of substrates, including flexible polymer substrates.

The invention claimed is:

1. A device for generating current and/or voltage comprising:
  a device configured for making a fluid flow between an inlet and an outlet of the device,
  a thermoelectric module placed in a path of the fluid between the inlet and the outlet, the thermoelectric module comprising:
    a thermally insulating substrate provided with a first active surface exposed to the fluid and a second active surface opposite to the first active surface, the first active surface being substantially perpendicular to a direction of flow of the fluid,
    a plurality of thermocouples arranged at first positions in the thermally insulating substrate, each thermocouple comprising two electrically conducting bumps electrically connected to one another on the first active surface of the thermoelectric module to form a hot junction or a cold junction, the thermocouples being electrically connected in series on the second active surface of the module to form a cold junction or a hot junction, and
    pass-through apertures made in the thermally insulating substrate at second positions distinct from the first positions so as to avoid contact between the fluid and the plurality of thermocouples.

2. The device according to claim 1, comprising a heat exchanger in thermal contact with the second active surface of the thermoelectric module.

3. The device according to claim 2, wherein the heat exchanger comprises a water circulation heat sink.

4. The device according to claim 1, comprising a heat exchange device arranged on the first active surface.

5. The device according to claim 1, wherein the thermoelectric module comprises a matrix of pass-through apertures connecting the first active surface to the second active surface, a thermocouple bump being adjacent to four pass-through apertures.

6. The device according to claim 1, wherein the thermoelectric module comprises a series of staggered pass-through apertures connecting the first active surface to the second active surface, a thermocouple bump being adjacent to three pass-through apertures.

7. The device according to claim 1, wherein the thermoelectric module comprises a matrix of pass-through apertures connecting the first active surface to the second active surface, a set of four thermocouple bumps being surrounded by four pass-through apertures, each thermocouple bump being adjacent to two pass-through apertures of these four pass-through apertures.

8. The device according to claim 1, wherein the thermoelectric module has two opposites plane surfaces and the plurality of pass-through apertures are connecting the two opposites faces for allowing the fluid to flow through the thermoelectric module.

9. The device according to claim 8, wherein the plurality of pass-through apertures presents a constant diameter between the two opposites surfaces.

10. The device according to claim 1, wherein one of the plurality of pass-through apertures has four, six or eight thermocouple bumps as closest neighbors.

11. The device according to claim 1, wherein one of the thermocouple bumps has four of the plurality of pass-through apertures as closest neighbors.

12. The device according to claim 1, further comprising a pipe having a longitudinal axis parallel to a longitudinal axes of the plurality of pass-through apertures, the thermoelectric module being placed in the pipe and the fluid flowing the pipe.

13. The device according to claim 12, wherein the plurality of thermocouples is arranged in the thermally insulating substrate so as to be thermally insulating from a material forming the pipe.

* * * * *